(12) United States Patent
Breitling et al.

(10) Patent No.: US 10,023,460 B2
(45) Date of Patent: *Jul. 17, 2018

(54) STRUCTURES FOR REDUCING AND AVOIDING STRESSES ON THE SEAL BOTTOM SIDE DURING LASER RESEAL

(71) Applicant: Robert Bosch GmbH, Stuttgart (DE)

(72) Inventors: Achim Breitling, Reutlingen (DE);
Frank Reichenbach, Wannweil (DE);
Jochen Reinmuth, Reutlingen (DE);
Julia Amthor, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/333,381

(22) Filed: Oct. 25, 2016

(65) Prior Publication Data

US 2017/0113921 A1    Apr. 27, 2017

(30) Foreign Application Priority Data

Oct. 26, 2015   (DE) .................... 10 2015 220 892

(51) Int. Cl.
*G01L 9/00* (2006.01)
*B81B 7/00* (2006.01)
(Continued)

(52) U.S. Cl.
CPC .............. *B81B 7/0051* (2013.01); *B81B 7/02* (2013.01); *B81C 1/00293* (2013.01);
(Continued)

(58) Field of Classification Search
CPC .......... B81C 1/00325; B81C 2201/013; B81C 2203/0145; B81B 7/0051; B81B 2201/0235; B81B 2201/0242
See application file for complete search history.

(56) References Cited

U.S. PATENT DOCUMENTS

| 2017/0113919 A1* | 4/2017 | Reichenbach ........ B81B 7/0035 |
| 2017/0113920 A1* | 4/2017 | Reichenbach ........ B81B 7/0048 |
| 2017/0113923 A1* | 4/2017 | Reichenbach ............ B81B 7/02 |

FOREIGN PATENT DOCUMENTS

WO        2015120939 A1    8/2015

* cited by examiner

*Primary Examiner* — Thanh Y Tran
(74) *Attorney, Agent, or Firm* — Norton Rose Fulbright US LLP; Gerard Messina

(57) ABSTRACT

A method for manufacturing a micromechanical component including a substrate and including a cap, which is connected to the substrate and, together with the substrate, encloses a first cavity, a first pressure prevailing and a first gas mixture having a first chemical composition being enclosed in the first cavity. An access opening connecting the first cavity to surroundings of the micromechanical component is formed in the substrate or in the cap. The first pressure and/or the first chemical composition is adjusted in the first cavity. The access opening is sealed by introducing energy or heat via laser into an absorbing part of the substrate or the cap. During the step for forming the access opening, a first access opening section is formed generally perpendicularly to a surface of the substrate or the cap, and a second access opening section is formed generally perpendicularly to and in parallel to the surface.

8 Claims, 5 Drawing Sheets

(51) Int. Cl.
*B81C 1/00* (2006.01)
*B81B 7/02* (2006.01)
(52) U.S. Cl.
CPC .. *B81C 1/00325* (2013.01); *B81B 2201/0235* (2013.01); *B81B 2201/0242* (2013.01); *B81C 2201/013* (2013.01); *B81C 2203/0145* (2013.01)

STRUCTURES FOR REDUCING AND AVOIDING STRESSES ON THE SEAL BOTTOM SIDE DURING LASER RESEAL

CROSS REFERENCE

The present application claims the benefit under 35 U.S.C. § 119 of German Patent Application No. DE 102015220892.3 filed on Oct. 26, 2015, which is expressly incorporated herein by reference in its entirety.

FIELD

The present invention is directed to a method for manufacturing a micromechanical component.

BACKGROUND INFORMATION

A method for manufacturing a micromechanical component is described in PCT Application WO 2015/120939 A1. When a certain internal pressure is desired in a cavity of a micromechanical component or a gas mixture having a certain chemical composition is to be enclosed in the cavity, the internal pressure or the chemical composition is frequently adjusted during capping of the micromechanical component or during the bonding process between a substrate wafer and a cap wafer. During capping, for example, a cap is connected to a substrate, whereby the cap and the substrate together enclose the cavity. By adjusting the atmosphere or the pressure and/or the chemical composition of the gas mixture present in the surroundings during capping, it is thus possible to adjust the certain internal pressure and/or the certain chemical composition in the cavity.

With the aid of the method described in PCT Application WO 2015/120939 A1, an internal pressure may be adjusted in a targeted way in a cavity of a micromechanical component. It is in particular possible with the aid of this method to manufacture a micromechanical component having a first cavity, a first pressure and a first chemical composition being adjustable in the first cavity, which differ from a second pressure and a second chemical composition at the time of capping.

In the method for targeted adjusting of an internal pressure in a cavity of a micromechanical component described in PCT Application WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and hermetically seals the access channel during solidification.

SUMMARY

It is an object of the present invention to provide a method for manufacturing a micromechanical component which is mechanically robust and has a long service life in a simple and cost-effective manner. It is a further object of the present invention to provide a micromechanical component which is compact, mechanically robust and has a long service life. According to the present invention, this applies in particular to a micromechanical component including one (first) cavity. With the aid of the method according to the present invention and the micromechanical component according to the present invention, it is furthermore also possible to implement a micromechanical component in which a first pressure and a first chemical composition may be adjusted in the first cavity, and a second pressure and a second chemical composition may be adjusted in a second cavity. For example, such a method for manufacturing micromechanical components is provided, for which it is advantageous if a first pressure is enclosed in a first cavity and a second pressure is enclosed in a second cavity, the first pressure being different from the second pressure. This is the case, for example, when a first sensor unit for rotation rate measurement and a second sensor unit for acceleration measurement are to be integrated into a micromechanical component.

The object may be achieved in accordance with example embodiments of the present invention in that
   in a first method sub-step during the first method step for forming the access opening, a first access opening section is formed generally perpendicularly to a surface of the substrate or the cap,
   in a second method sub-step during the first method step for forming the access opening, a second access opening section being formed generally perpendicularly to and in parallel to the surface to relieve mechanical stresses occurring when the access opening is sealed.

In this way, a method for manufacturing a micromechanical component is provided in a simple and cost-effective manner, with the aid of which local stresses occurring in the area of the access opening may be relieved and distributed. In particular, it is possible with the aid of the method according to the present invention to relieve or distribute local stresses occurring in the area of the access opening between a part of the access opening which is sealed during the third method step and the first cavity. Furthermore, it is possible with the aid of the method according to the present invention to considerably reduce or avoid conventionally occurring stress peaks, in particular on the seal bottom side in the area of the access channel or the access opening. In particular, it is possible with the aid of the second access opening section to relieve mechanical stresses due to elastic deformation. Compared to a method in which the second access opening section is not formed, the method according to the present invention has the advantage, for example, that a material area solidified after the third method step and/or the interfaces between the solidified material area and the remaining substrate or the remaining cap and/or the area around the interfaces is/are less susceptible to crack-formation since locally occurring stresses may be effectively relieved or distributed to a larger material area with the aid of the second access opening section. As a result of the method according to the present invention, it is thus less critical if unintentional contact is made with the solidified material area, for example during the production flow, since, due to reduced local stresses, the solidified material area is less likely to be the cause and originating point of cracks. It is also less problematic with the method according to the present invention if the substrate material is only heated locally, and the heated material contracts relative to its surroundings, both during solidification and during cooling. It is also less problematic that a very high tensile stress may develop in the sealing area, in particular on the seal bottom side in the area of the access channel or the access opening, since the relief of local mechanical stresses means that an additionally occurring mechanical stress that is considerably higher than in conventional methods is needed to result in component failure. As a result, spontaneous crack formation which occurs as a function of the stress and the material is less likely. Crack formation under thermal or mechanical load of the micromechanical component during further processing or in the field is also less likely, since mechanical stress or pretension present in the micromechanical component, in particular on the sealing bottom side in the area of the access channel or the access opening, is considerably lower than in micromechanical components manufactured with the aid of already known methods. In particular, it is less critical with the method according to the present invention if, during solidification of the material area, a tip or an overhang of the tip forms across the surface of the substrate or the cap due to the recrystallization dynamics in the center of the fused zone or in the center of the solidified material area. The likelihood of damage to such a tip or negative effects due to unintentional contact with the tip, for example during the further production flow, may be effectively reduced by using the second access opening section. The method according to the present invention is thus an effective option for reducing the likelihood that the solidified material area or the tip is the cause or originating point of cracks. In this way, a method for manufacturing a micromechanical component which is mechanically robust and has a long service life compared to the related art in a simple and cost-effective manner is provided.

In connection with the present invention, the term "micromechanical component" is to be understood in that the term encompasses both micromechanical components and microelectromechanical components.

The present invention is preferably provided for the manufacture of a or for a micromechanical component having a cavity. However, the present invention is also provided, for example, for a micromechanical component having two cavities, or having more than two, i.e., three, four, five, six or more than six, cavities.

The access opening is preferably sealed by introducing energy or heat with the aid of a laser into a part of the substrate or of the cap which absorbs this energy or this heat. Energy or heat is preferably introduced chronologically in series into the respective absorbing part of the substrate or of the cap of multiple micromechanical components, which are manufactured together on a wafer, for example. However, alternatively, it is also possible to introduce the energy or heat simultaneously into the respective absorbing part of the substrate or of the cap of multiple micromechanical components, for example using multiple laser beams or laser devices.

Advantageous embodiments and refinements of the present invention may be derived from the description herein with reference to the figures.

According to one preferred refinement, it is provided that the cap, together with the substrate, encloses a second cavity, a second pressure prevailing and a second gas mixture having a second chemical composition being enclosed in the second cavity.

Another object of the present invention is a method for manufacturing a micromechanical component including a substrate and including a cap, which is connected to the substrate and, together with the substrate, encloses a first cavity and a second cavity, a first pressure prevailing and a first gas mixture having a first chemical composition being enclosed in the first cavity, a second pressure prevailing and a second gas mixture having a second chemical composition being enclosed in the second cavity, in a first method step, an access opening connecting the first cavity to surroundings of the micromechanical component being formed in the substrate or in the cap,
in a second method step, the first pressure and/or the first chemical composition in the first cavity being adjusted,
in a third method step, the access opening being sealed by introducing energy or heat with the aid of a laser into an absorbing part of the substrate or the cap,
in a first method sub-step during the first method step for forming the access opening, a first access opening section being formed essentially perpendicularly to a surface of the substrate or the cap,
in a second method sub-step during the first method step for forming the access opening, a second access opening section being formed essentially perpendicularly to and in parallel to the surface to relieve mechanical stresses occurring when the access opening is sealed.

According to one preferred refinement, it is provided that in a third method sub-step during the first method step for forming the access opening, a third access opening section is formed essentially perpendicularly to the surface. In this way, it is advantageously achieved that the second access opening section may be situated spaced apart from the surface and spaced apart from the first cavity.

According to one preferred refinement, it is provided that the first access opening section is formed with the aid of anisotropic etching and/or the second access opening section is formed with the aid of isotropic etching and/or the third access opening section is formed with the aid of anisotropic etching. This advantageously makes it possible for the first access opening section and/or the third access opening section to be provided anisotropically or in an elongated manner, in the sense of a larger expansion of the first access opening section and/or of the third access opening section essentially perpendicularly to the surface instead of in parallel to the surface, or in the sense of a smaller expansion of the first access opening section and/or of the third access opening section essentially perpendicularly to the surface instead of in parallel to the surface. Furthermore, this advantageously makes it possible to design the second access opening section in such a way that the second access opening section, compared to the first access opening section and/or compared to the third access opening section, is formed into the substrate or into the cap essentially in parallel to the surface, or that the second access opening section includes an expansion or a recess. According to one preferred refinement, it is provided that the second access opening section is designed in such a way that a first distance, extending essentially perpendicularly to the surface, between the second access opening section and the surface is at a maximum twice as large as a second distance, extending essentially perpendicularly to the surface, between a maximum extension of the absorbing part and the surface. This advantageously makes it possible for the second access opening section and the absorbing part to be situated relatively closely together, so that mechanical stresses and stress peaks occurring in the area of the sealed access opening, in particular on the side of the sealed access opening facing the first cavity, may be effectively relieved or reduced with the aid of the second access opening section.

According to one preferred refinement, it is provided that the second access opening section is designed in such a way that a ratio between a depth of the second access opening section extending essentially in parallel to the surface with respect to the first access opening section and/or with respect to the third access opening section and a third distance, extending essentially perpendicularly to the surface, between the second access opening section and a maximum extension of the absorbing part is at least 0.5, in particular equal to or greater than 1. In this way, occurring mechanical stresses and stress peaks may be relieved or reduced particularly effectively.

According to one preferred refinement, it is provided that the second access opening section is designed in such a way that the absorbing part of the substrate or of the cap and the material of the substrate or of the cap surrounding the second access opening section at least partially overlap. In this way, advantageously a rounding is made possible between a material area which is converted into a liquid aggregate state in the third method step and the second access opening section, or a rounding of the access channel seal.

A further object of the present invention is a micromechanical component including a substrate and a cap which is connected to the substrate and, together with the substrate, encloses a first cavity, a first pressure prevailing and a first gas mixture having a first chemical composition being enclosed in the first cavity, the substrate or the cap including a sealed access opening, the access opening including a first access opening section which is designed generally perpendicularly to a surface of the substrate or of the cap, the access opening including a second access opening section which is designed generally perpendicularly to and in parallel to the surface for relieving mechanical stresses occurring when the access opening is sealed.

According to one preferred refinement, it is provided that the cap, together with the substrate, encloses a second cavity, a second pressure prevailing and a second gas mixture having a second chemical composition being enclosed in the second cavity.

Moreover, a further object of the present invention is a micromechanical component including a substrate and a cap which is connected to the substrate and, together with the substrate, encloses a first cavity and a second cavity, a first pressure prevailing and a first gas mixture having a first chemical composition being enclosed in the first cavity, a second pressure prevailing and a second gas mixture having a second chemical composition being enclosed in the second cavity, the substrate or the cap including a sealed access opening, the access opening including a first access opening section which is designed generally perpendicularly to a surface of the substrate or of the cap, the access opening including a second access opening section which is designed essentially perpendicularly to and in parallel to the surface for relieving mechanical stresses occurring when the access opening is sealed. In this way, a compact, mechanically robust and cost-effective micromechanical component having an adjusted first pressure and second pressure is advantageously provided. The above-mentioned advantages of the method according to the present invention apply correspondingly also to the micromechanical component according to the present invention.

According to one preferred refinement, it is provided that the access opening includes a third access opening section designed generally perpendicularly to the surface. In this way, a micromechanical component is thereby provided, the second access opening section advantageously being situated spaced apart from the surface and spaced apart from the first cavity.

According to one preferred refinement, it is provided that a ratio between a depth of the second access opening section extending generally in parallel to the surface with respect to the first access opening section and/or with respect to the third access opening section and a third distance, extending essentially perpendicularly to the surface, between the second access opening section and a maximum extension of a part absorbing energy or heat introduced during the sealing of the access opening is at least 0.5, in particular equal to or greater than 1. In this way, a micromechanical component is provided, with the aid of which occurring mechanical stresses and stress peaks may be relieved or reduced particularly effectively.

According to one preferred refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION OF EXAMPLE EMBODIMENTS

Figure 1:
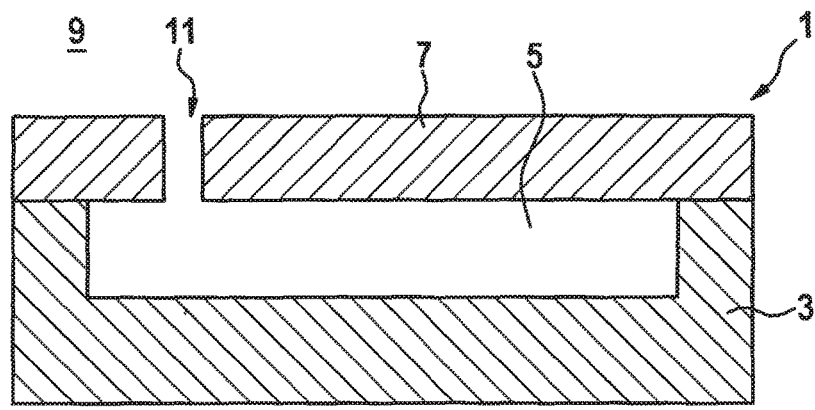
FIG. 1 shows a micromechanical component having an open access opening according to one exemplary specific embodiment of the present invention in a schematic representation.

Identical parts are denoted by the same reference numerals in the various figures and are therefore generally also cited or mentioned only once.

Figure 2:
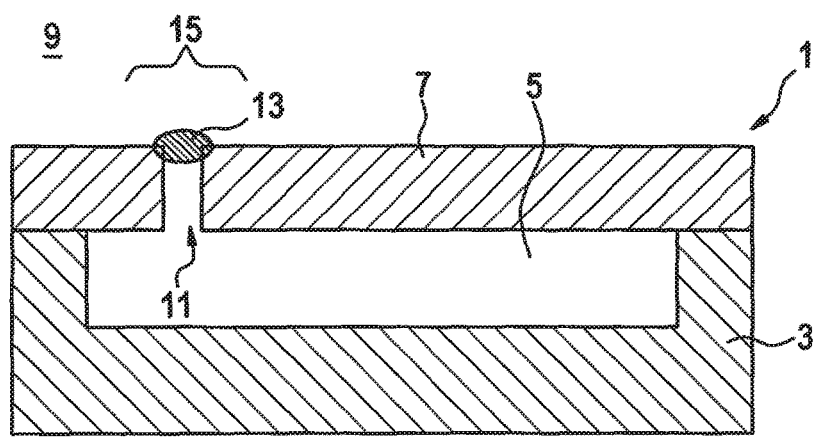
FIG. 2 shows the micromechanical component according to FIG. 1 having a sealed access opening in a schematic representation.

FIG. 1 and FIG. 2 show schematic representations of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, preferably hermetically, connected to one another and together enclose a first cavity 5. For example, micromechanical component 1 is designed in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as shown in FIG. 2. Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 is preferably situated in substrate 3 or in cap 7. In the present exemplary embodiment, access opening 11 is situated in cap 7 by way of example. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
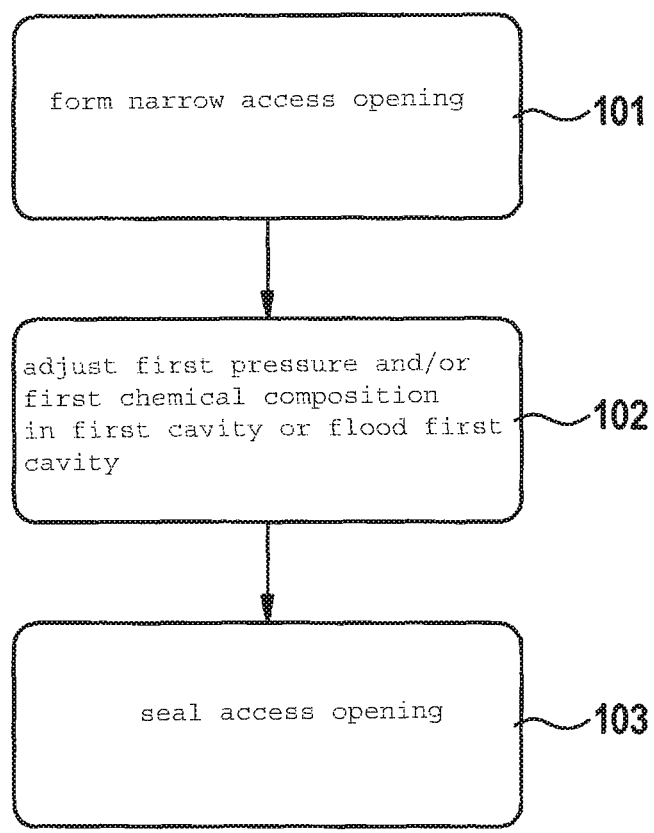
FIG. 3 shows a method for manufacturing a micromechanical component according to one exemplary specific embodiment of the present invention in a schematic representation.

FIG. 3 shows a method for manufacturing micromechanical component 1 according to one exemplary specific embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is adjusted, or first cavity 5 is flooded with the desired gas and the desired internal pressure via the access channel. Furthermore, for example, in a third method step 103, access opening 11 is sealed by introducing energy or heat with the aid of a laser into an absorbing part 21 of substrate 3 or cap 7. Alternatively, for example, it is also provided that in a third method step 103, the area around the access channel is preferably heated only locally by a laser, and the access channel is hermetically sealed. It is thus advantageously possible to provide the method according to the present invention also with other energy sources than with a laser for sealing access opening 11. FIG. 2 shows micromechanical component 1 after third method step 103 by way of example.

Chronologically after third method step 103, it is possible for mechanical stresses to occur in a lateral area 15, shown by way of example in FIG. 2, on surface 19 and in the depth perpendicularly to a projection of lateral area 15 onto surface 19, i.e., along access opening 11 and in the direction of first cavity 5 of micromechanical component 1. These mechanical stresses, in particular local mechanical stresses, prevail in particular on and in the vicinity of an interface between a material area 13 of cap 7, which in third method step 103 transitions into a liquid aggregate state and after third method step 103 transitions into a solid aggregate state and seals access opening 11, and a remaining area of cap 7, which remains in a solid aggregate state during third method step 103. In FIG. 2, material area 13 of cap 7 sealing access opening 11 is to be regarded only schematically or is shown only schematically, in particular with respect to its lateral extension or form, extending in particular in parallel to surface 19, and in particular with respect to its expansion or configuration perpendicularly to the lateral extension, running in particular perpendicularly to surface 19.

Figure 4:
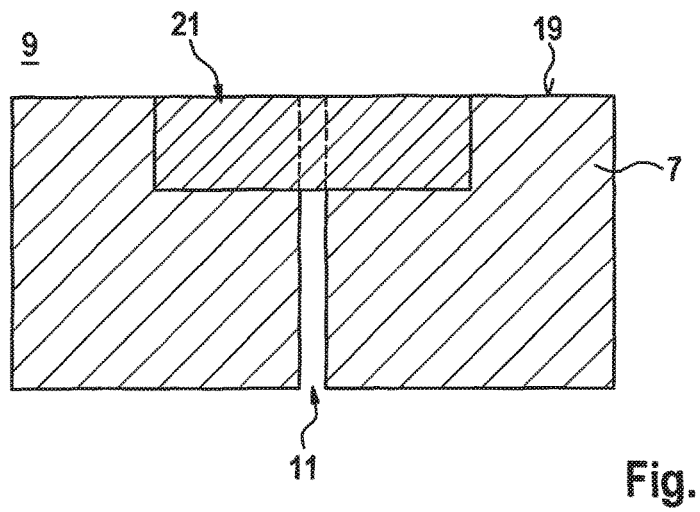
FIG. 4 shows a subarea of a conventional micromechanical component in a schematic representation.

FIG. 4 shows a subarea of an already known micromechanical component in a schematic representation. FIG. 5, FIG. 6, FIG. 7 and FIG. 8 show subareas of a micromechanical component according to exemplary specific embodiments of the present invention in schematic representations. To relieve stress peaks at the seal bottom side or in the area beneath absorbing part 21, a local widening or recess is introduced during the structuring of access channel 11 at a defined depth. This is shown by way of example in FIG. 5, FIG. 6, FIG. 7, and FIG. 8. Stresses in the solidified fused area 21 are relieved via elastic deformation, for example, by the material or substrate 3 or cap 7, which directly adjoins fused area 21 or absorbing part 21. In addition, it is also possible for stress peaks to be relieved or reduced or avoided by rounding.

For this purpose, for example, in a first method sub-step during first method step 101 for forming access opening 11 shown in FIG. 3, a first access opening section 401 is formed generally perpendicularly to a surface 19 of substrate 3 or cap 7. Furthermore, for example, in a second method sub-step during first method step 101 for forming access opening 11, a second access opening section 403 is formed generally perpendicularly to and in parallel to surface 19 to relieve mechanical stresses occurring when access opening 11 is sealed. In addition, subsequently, for example, in a third method sub-step during first method step 101 for forming access opening 11, a third access opening section 405 is formed generally perpendicularly to surface 19.

Furthermore, for example, first access opening section 401 is formed with the aid of anisotropic etching, second access opening section 403 is formed with the aid of isotropic etching, and third access opening section 405 is formed with the aid of anisotropic etching. In other words, a narrow access channel is created in the cap wafer or in the sensor wafer through the substrate to the MEMS cavity, preferably with the aid of anisotropic etching. Thereafter, the process is switched to an isotropic etching, for example at a defined etching depth, so that a local widening 403 of the access channel 11 takes place. Thereafter, the access channel is finished, for example with the aid of anisotropic etching.

The etching depth at which the widening begins, or a distance, running essentially perpendicularly to surface 19, between surface 19 and second access opening section 403 corresponds at a maximum to twice the fusion depth, or a further distance, running essentially perpendicularly to surface 19, between surface 19 and a maximum extension of absorbing part 21, and advantageously is 1.5 times the fusion depth.

Figure 5:
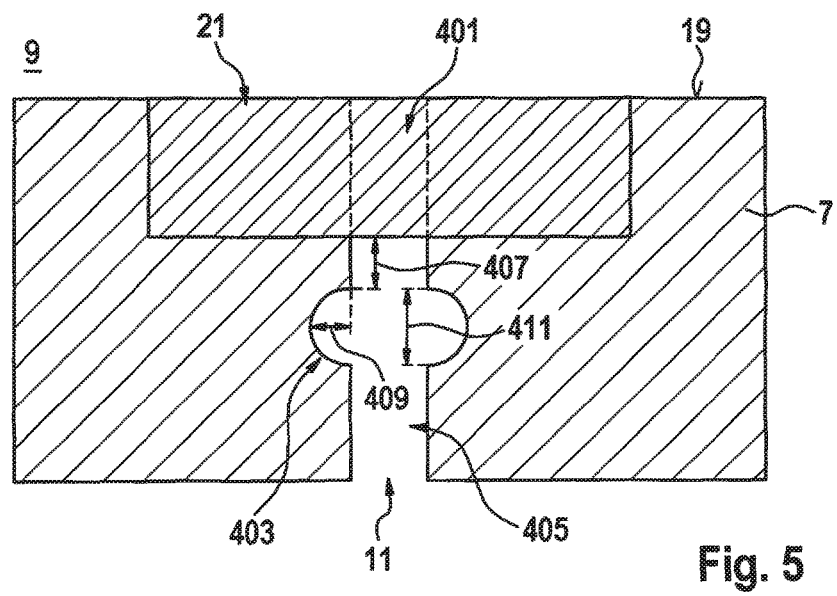
FIG. 5, FIG. 6, FIG. 7 and FIG. 8 show subareas of a micromechanical component according to exemplary specific embodiments of the present invention in schematic representations.
Figure 6:
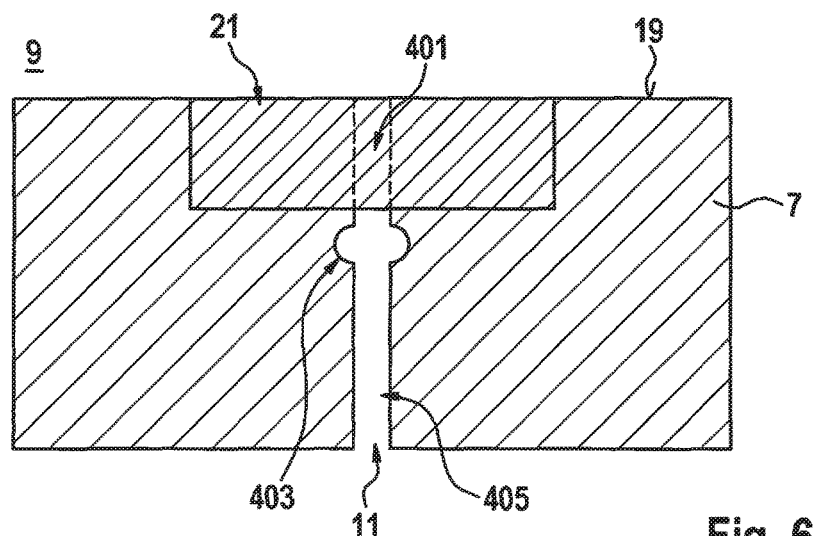

Furthermore, a ratio between a widening width 409 of second access opening 403, shown in FIG. 5, and a distance 407 of widening 403 from fusion area 21 is at least 0.5, and advantageously is greater than 1.

Figure 7:
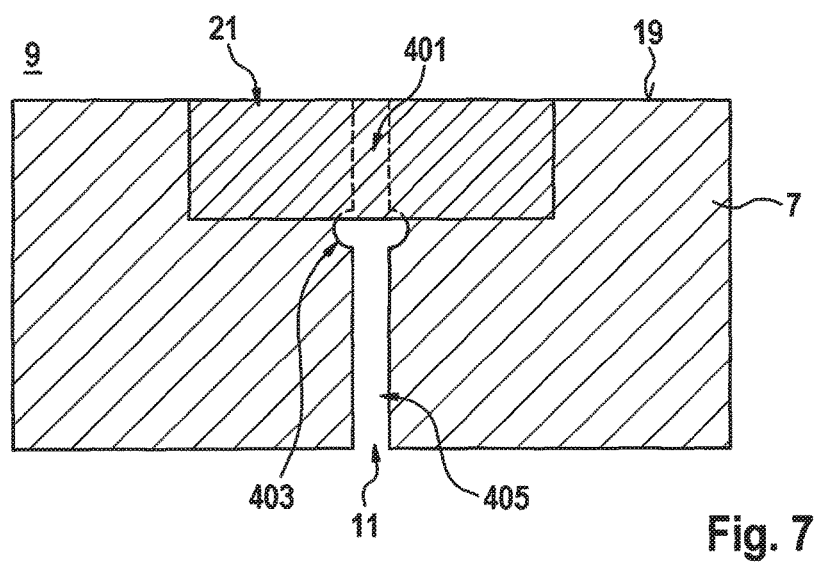

FIG. 7 shows, by way of example, that alternatively it is also provided that the upper portion of widening 403 is situated in fusion area 21. This advantageously results in a rounding of the access channel seal, or of the material area which has transitioned into a liquid aggregate state in the third method step and a solid aggregate state after the third method step. For example, the portion of widening 403 which is situated in fusion area 21 is smaller than half a widening height 411 shown in FIG. 5.

Figure 8:
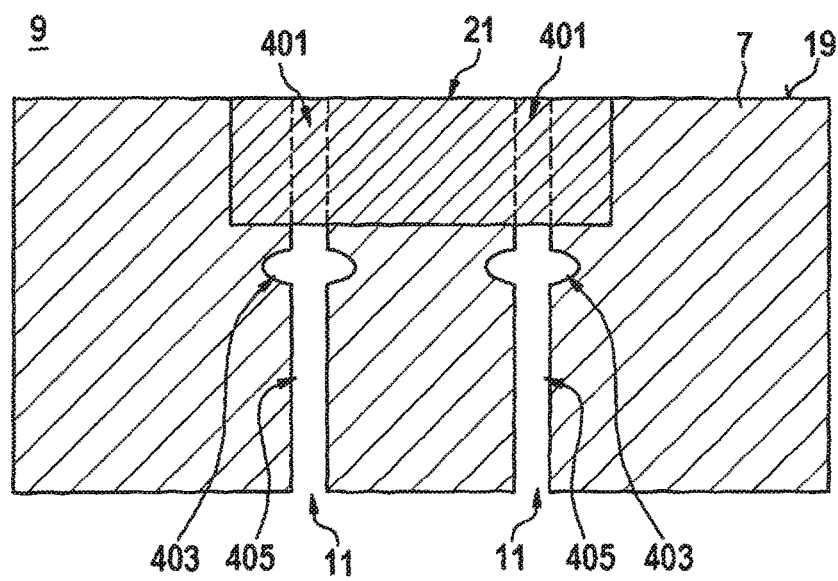

Finally, FIG. 8 shows access channels 11, access channels 11 each including a second access opening section 403 or isotropic area 403. Here it is provided, for example, that isotropic area 403 is situated spaced apart from, for example, a side of access channel 11 facing away from surface 19, or only spaced apart from surface 19 and from first cavity 5. For example, access channels 11 or isotropic areas 403 or structures shown in FIG. 8 are etched in such a way that, during etching, first an isotropic etching step takes place at the end of the etching process, or on a side of access channel 11 facing first cavity 5, whereby an undercut is created at the etching base before the access channel is completed with a further anisotropic etching step. In particular, it is provided that the undercut is designed in such a way that the undercut extends essentially in parallel to surface 19 or, compared to remaining access channel 11, projects at least partially into cap 7 in parallel to surface 19.

For example, it is also provided that second access opening section 403 or widening 403 or recess is combined with structures for stress relief. In other words, the structure of the micromechanical component according to the present invention may optionally also be combined with stress relief structures outside fusion area 21.

What is claimed is:

1. A method for manufacturing a micromechanical component including a substrate, and a cap which is connected to the substrate and, together with the substrate, encloses a first cavity, a first pressure prevailing and a first gas mixture having a first chemical composition being enclosed in the first cavity, the method comprising:
   in a first step, forming an access opening connecting the first cavity to surroundings of the micromechanical component in the substrate or in the cap;
   in a second step, adjusting at least one of the first pressure and the first chemical composition in the first cavity;
   in a third step, sealing the access opening by introducing energy or heat into an absorbing part of the substrate or the cap, with the aid of a laser;
   in a first sub-step during the first step, forming a first access opening section perpendicularly to a surface of the substrate or the cap; and
   in a second sub-step during the first step, forming a second access opening section in parallel to the surface to relieve mechanical stresses occurring when the access opening is sealed.

2. The method as recited in claim 1, wherein the cap, together with the substrate, encloses a second cavity, a second pressure prevailing and a second gas mixture having a second chemical composition being enclosed in the second cavity.

3. The method as recited in claim 1, further comprising:
   in a third sub-step during the first step, a third access opening section is formed perpendicularly to the surface.

4. The method as recited in claim 3, wherein at least one of:
   the first access opening section is formed with the aid of anisotropic etching;
   the second access opening section is formed with the aid of isotropic etching; and
   the third access opening section is formed with the aid of anisotropic etching.

5. The method as recited in claim 1, wherein the second access opening section is configured in such a way that a first distance, extending perpendicularly to the surface, between the second access opening section and the surface is at a maximum twice as large as a second distance, extending perpendicularly to the surface, between a maximum extension of the absorbing part and the surface.

6. The method as recited in claim 1, wherein the second access opening section is configured in such a way that a ratio between a depth extending perpendicularly from the surface to where the second access opening section begins and a distance, extending perpendicularly to the surface, between the surface and a maximum extension of the absorbing part, is at most 2.

7. The method as recited in claim 1, wherein the second access opening section is configured in such a way that a ratio between a width of the second access opening section extending in parallel to the surface and a third distance, extending perpendicularly to the surface, between the second access opening section and a maximum extension of the absorbing part, is equal to or greater than 1.

8. The method as recited in claim 1, wherein the second access opening section is configured in such a way that the absorbing part of the substrate or of the cap and the material of the substrate or of the cap surrounding the second access opening section at least partially overlap.

* * * * *